United States Patent [19]

Hattori et al.

[11] Patent Number: 5,489,339
[45] Date of Patent: Feb. 6, 1996

[54] MICROELECTRONIC PROCESSING MACHINE

[75] Inventors: Takeo Hattori, Yokohama; Masatoshi Yasutake, Tokyo, both of Japan

[73] Assignees: Seiko Instruments Inc., Tokyo; Takao Hattori, Yokohama, both of Japan

[21] Appl. No.: 208,145

[22] Filed: Mar. 10, 1994

[30] Foreign Application Priority Data

Mar. 10, 1993  [JP]  Japan .................................. 5-049713

[51] Int. Cl.⁶ .................................................. C23C 16/00
[52] U.S. Cl. ...................... 118/723 R; 118/715; 118/729; 118/666; 118/669; 118/670; 118/684; 118/697; 118/500; 250/306; 250/492.2
[58] Field of Search .................................. 118/715, 729, 118/723 R, 666, 669, 670, 679–684, 692–697, 500; 250/306, 492.2

[56] References Cited

U.S. PATENT DOCUMENTS

| Re. 34,331 | 8/1993 | Elings | 250/306 |
|---|---|---|---|
| 4,343,993 | 8/1982 | Binning | 250/306 |
| 4,539,089 | 9/1985 | Binning | 204/192 R |
| 4,550,257 | 10/1985 | Binning | 250/306 |
| 4,668,865 | 5/1987 | Gimzewski | 250/306 |
| 4,724,318 | 2/1988 | Binning | 250/306 |
| 4,762,996 | 8/1988 | Binning | 250/306 |
| 4,868,007 | 9/1989 | Taguchi | 427/96 |
| 4,896,044 | 1/1990 | Li | 250/492.3 |
| 5,015,323 | 5/1991 | Gallagher | 156/345 |
| 5,038,322 | 8/1991 | Van Loenen | 365/114 |
| 5,043,578 | 8/1991 | Güethner | 250/307 |
| 5,047,649 | 9/1991 | Hodgson | 250/492.2 |
| 5,186,982 | 2/1993 | Blette | 427/256 |
| 5,229,606 | 7/1993 | Elings | 250/306 |
| 5,266,801 | 11/1993 | Elings | 250/306 |

FOREIGN PATENT DOCUMENTS 262331  10/1990  Japan .................................. 118/666

Primary Examiner—R. Bruce Breneman
Assistant Examiner—Jeffrie R. Lund
Attorney, Agent, or Firm—Loeb and Loeb

[57] ABSTRACT

An electrode capable of pushing against a silicon substrate with a constant force is mounted inside a vacuum chamber or a gas-replacing chamber. A bias voltage source can supply a given electrical current between the silicon substrate and the electrode. A temperature-controlled heater and a positioning mechanism are mounted under the silicon substrate. A gas inlet nozzle for adjusting the ambient is mounted close to the location of the substrate.

12 Claims, 5 Drawing Sheets

* A SIGNAL SUPPLIED TO MOVE THE SAMPLE INTO THE NEXT PIXEL 5,489,339

MICROELECTRONIC PROCESSING MACHINE

BACKGROUND OF THE INVENTION

The present invention relates to a machine for writing microminiature interconnects having line widths of the order of nanometers into an oxide film and a nitride film on a silicon substrate.

When thin conductive interconnects are formed on an oxide film lying on a silicon substrate by a conventional method, the silicon surface is oxidized uniformly up to a certain thickness by thermal oxidation or other methods. Then, a resist material is uniformly applied to this surface. The resist material is exposed through a mask which has been photolithographically patterned by an electron-beam exposure machine or the like. Finally, unwanted silicon oxide ($SiO_2$) is etched away. In this method, once the masking material is prepared, batch processing is enabled. Thus, a large number of devices can be processed. However, the minimum line width is limited to 100 to 200 nm by the effects of lateral etching. Furthermore, a large number of process steps such as oxidation, lithography, and etching, as described above, are necessary.

The atomic force microscope (AFM) was invented in 1986 by G. Binng, C. Ouate, C. Gerber, and others (see Phys. Rev. Lett., 56, 936 (1986)). The AFM, acting as an instrument for imaging surface topography, can create three-dimensional topographical images from samples including insulating samples at high resolution. The AFM is superior to other imaging instruments in these respects.

SUMMARY OF THE INVENTION

The present invention uses, as a writing electrode, a tip equipped with a lever as used with an atomic force microscope. The invention is also intended to write any desired microminiature conductive interconnects into an oxide film on a silicon substrate, by making use of excellent three-dimensional positioning accuracy for the tip.

Where microminiature interconnects are written into an oxide film on a silicon film by prior art techniques, numerous processes such as oxidation of the substrate, lithography, and etching are carried out. Also, numerous complex operations such as alignment of the substrate must be performed. In addition, the feasible minimum line width is limited to 100 to 200 nm. In view of these problems with the prior art techniques, the present invention provides a machine for directly forming an oxide film and a nitride film on a silicon substrate at an accuracy on the order of nanometers, or 10 to 100 nm, and writing desired patterns into them.

To provide the above-described improvements, the present invention is embodied in a microelectronic processing machine comprising: a sample substrate; an electrode which makes contact with a surface of the sample substrate; a force control system for pressing the electrode against the sample substrate with a given force; a temperature control system for controlling the surface of the sample substrate at a temperature; a bias power supply capable of supplying a given electrical current between the electrode and the sample substrate; a feeble current control system for detecting and controlling a feeble current flowing between the electrode and the sample substrate; an integrator for integrating the feeble current for a given time; a positioning mechanism for continuously moving the sample substrate; a nozzle for introducing a gas to form a film on the surface of the sample substrate; and a vacuum chamber or a chamber in which partial pressures of reactive gases are controlled, all of the sample substrate, electrode, force control system, temperature control system positioning mechanism, and nozzle being mounted in the chamber.

DESCRIPTION OF THE PREFERRED EMBODIMENTS

Figure 1:
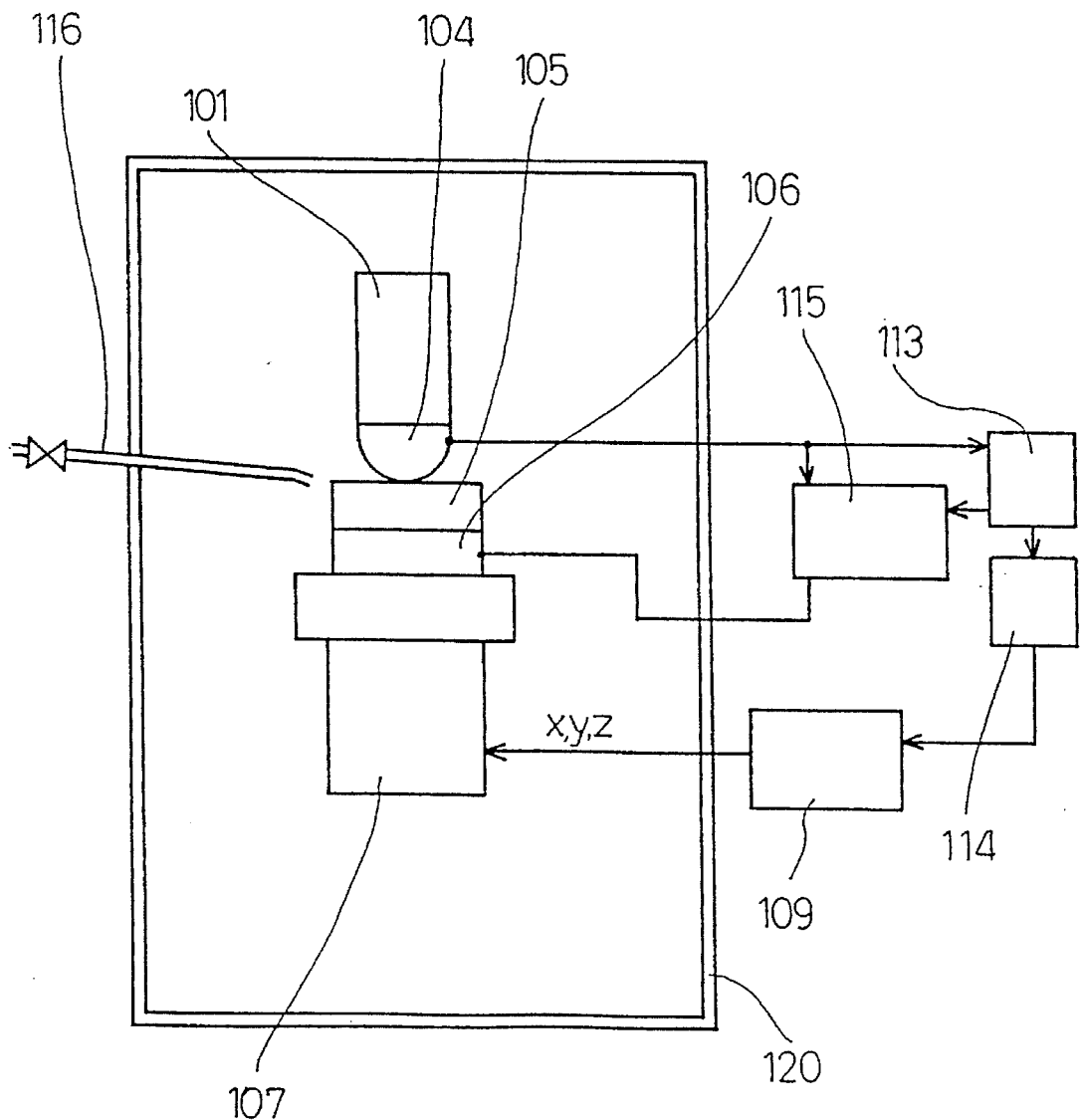
FIG. 1 is a simplified block diagram of a typical example of the structure of a microelectronic processing machine according to the invention.

FIG. 1 illustrate the basic components of a microelectronic processing machine according to a preferred embodiment of the invention. The illustrated machine includes a chamber 120, such as a vacuum chamber, within which gases may be selectively introduced and from which the gasses can be efficiently withdrawn, an electrode 104 mounted inside the chamber 120, and a bias voltage source 115 for applying a given voltage between the electrode 104 and a sample stage 106 for a given time. The stage 106 is electrically connected with a silicon substrate 105 which is treated as a sample. A strong electric field can be applied to the electrode 104. The electrode 104 is placed on the substrate 105 or in close proximity to the substrate 105. The electrode 104 is equipped with a force control system 101 which brings the electrode 104 into contact with the silicon substrate with a constant force at all times.

The silicon substrate 105 is held on or over the sample stage 106, stage 106 being equipped with a heating mechanism to maintain substrate 105 at a given temperature. A moving mechanism is mounted under the sample stage 106. This moving mechanism includes a precision positioning mechanism 107 driven by a z-axis servo control and x- and y-axis scanning system 109 and stage 106 has components including a preamplifier 113 for controlling the bias voltage source 115 such that the electrical current flowing between substrate 105 and electrode 104 is maintained constant. An integrator 114 is connected between preamplifier 113 and system 109. When the amount of electric charge flowing between substrate 105 and electrode 104 reaches a given value, the moving mechanism moves stage 106 to another position. A gas inlet nozzle 116 for maintaining partial pressures of reactive gases such as $O_2$ and $N_2$ has a delivery end disposed near sample stage 106.

The microelectronic processing machine constructed as described above operates in the manner described below.

Since a strong electric field is applied between the silicon substrate 105 and the electrode 104, gaseous elements in a thin silicon compound film on the silicon substrate 105 and under the electrode 104 and silicon at the silicon substrate surface are ionized. The ionized elements are coupled to the silicon. In this way, a silicon compound film is formed up to a given thickness at a constant rate. Thereafter, movement to another location is effected. As a result, a desired pattern is written into the silicon compound film.

A more specific embodiment of the present invention is described next with reference to FIG. 2. In this embodiment, an optical lever atomic force microscope is utilized as the mechanism for detecting forces and as the positioning mechanism. The structure is first described.

Figure 2:
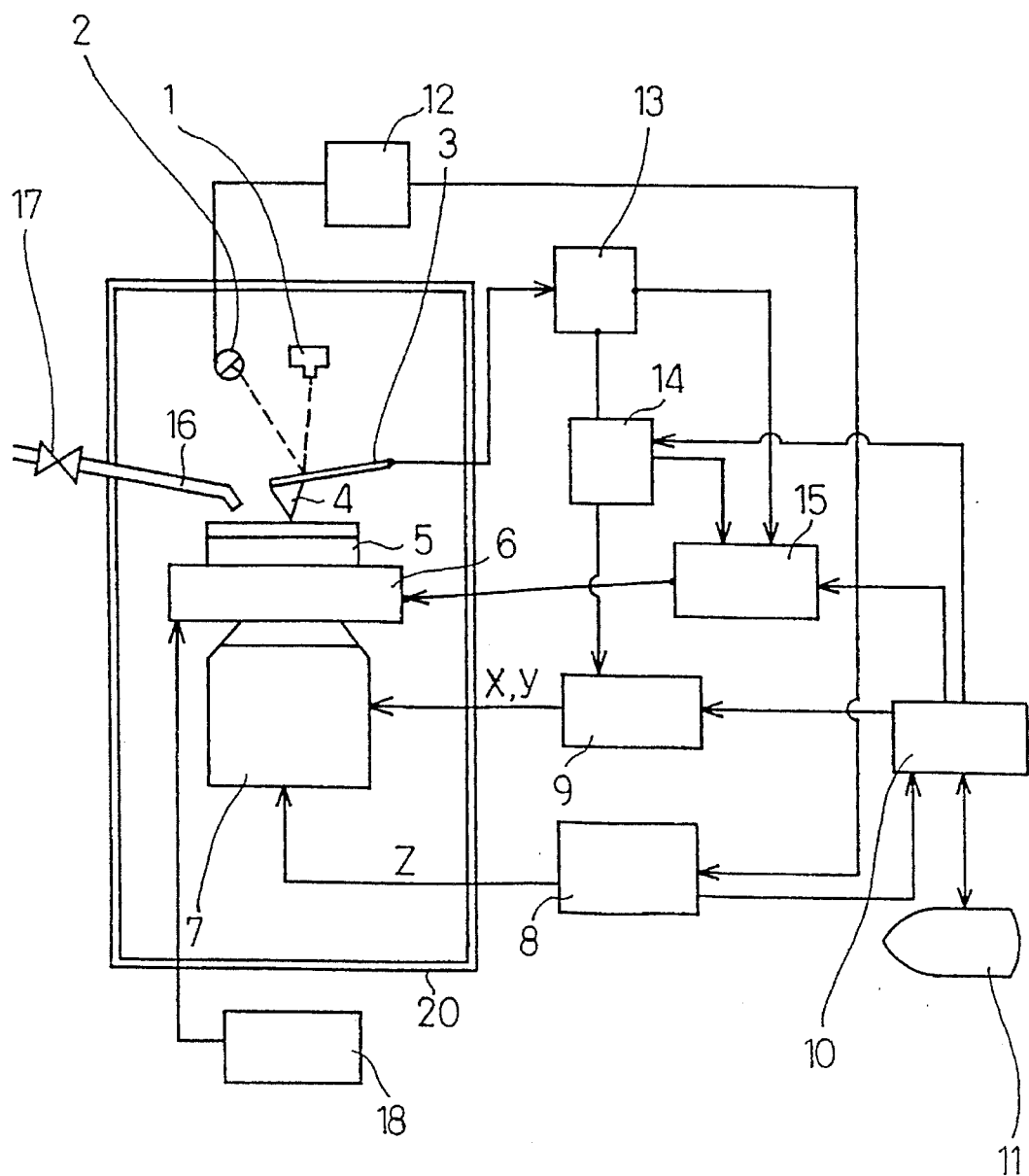
FIG. 2 is a more detailed block diagram of a microelectronic processing machine according to the invention.

Referring to FIG. 2, there are shown a semiconductor laser 1, a position-sensitive detector 2 consisting of two or four separate photodiodes, a cantilever 3, a conducting tip 4 acting as an electrode, a silicon substrate 5 constituting a sample, a sample stage 6 equipped with a heating mechanism, a three-dimensional piezoelectric scanner 7, a z-axis (vertical in the plane of FIG. 2) servo control system 8, an x-axis, y-axis (horizontal in the plane of FIG. 2 and perpendicular to the plane of FIG. 2, respectively) scanning system 9, an image processing-and-system control system 10, an image display system scanning pattern input system 11, preamplifiers 12 and 13, an integrator 14, a bias voltage source 15, a gas inlet nozzle 16, a gas flow-adjusting valve 17, a temperature controller 18, and a chamber 20, such as a vacuum chamber, into which different gasses can be replaceably introduced. The operation of this instrument is described below.

The ordinary silicon substrate 5 is used as a sample. The temperature of the sample is controlled and maintained at a given value on the sample stage 6 equipped with the heating mechanism. The partial pressure of oxygen or nitrogen gas in the immediate environs of sample 5 is controlled by means associated with chamber 20, such as nozzle 16.

The cantilever 3 to which conducting tip 4 is attached is located directly above silicon substrate 5 to place tip 4 in contact with substrate 5. Deflections of cantilever 3 are converted into an optical lever and monitored by semiconductor laser 1 and position-sensitive detector 2. The three-dimensional scanner 7 which can move the silicon substrate 5 in three dimensions, i.e., along the x-, y-, and z-axes, and acts as a three-dimensional precision positioning mechanism, is mounted under the sample stage 6 equipped with the heating mechanism. The three-dimensional piezoelectric scanner 7 is controlled by signals from preamplifier 12 and z-axis servo system 8 to maintain a constant amount of deflection of the cantilever 3, i.e. the pushing force with which tip 4 acts on silicon substrate 5 is kept constant.

A sequence of steps in which a pattern is written and an oxide film is formed is described next.

When a pattern to be written is entered from the image display system scanning pattern input system 11, the silicon substrate 5 is moved into a given position by the x–y scanning system 9 and the three-dimensional scanner 7.

Figure 3:
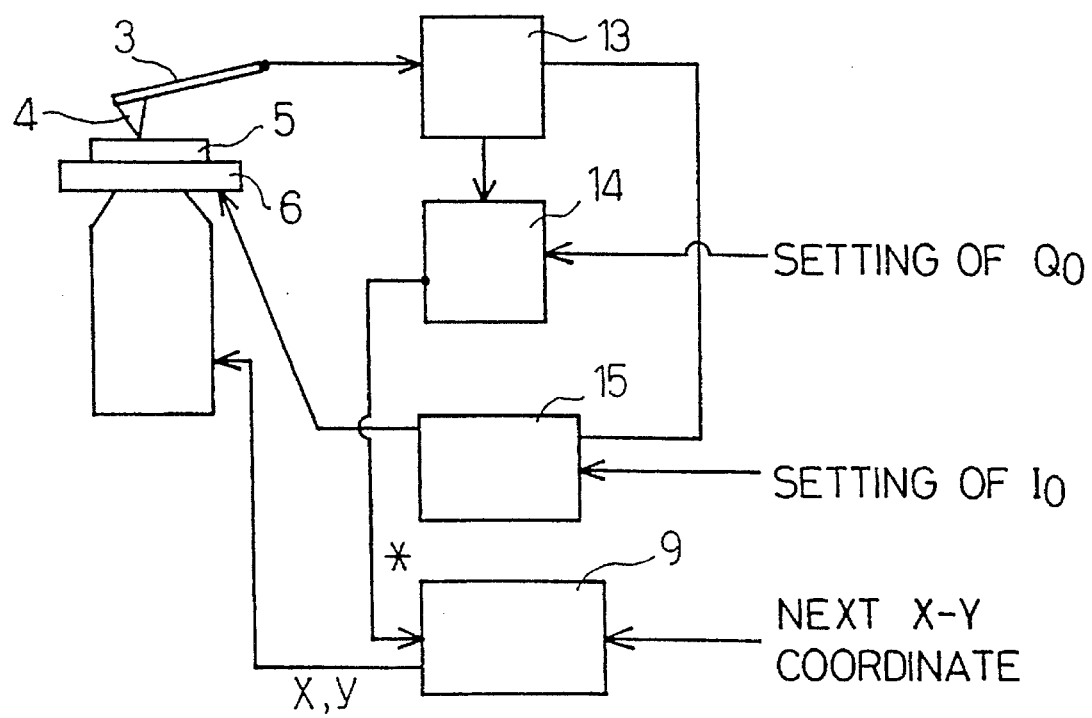
FIG. 3 is a diagram illustrating the operation of a microelectronic processing machine according to the invention.
Figure 4:
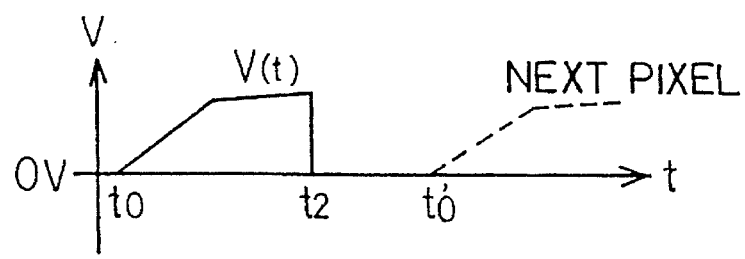
FIGS. 4(a), 4(b) and 4(c) are signal diagrams illustrating the operation of a microelectronic processing machine according to the invention.
Figure 4:
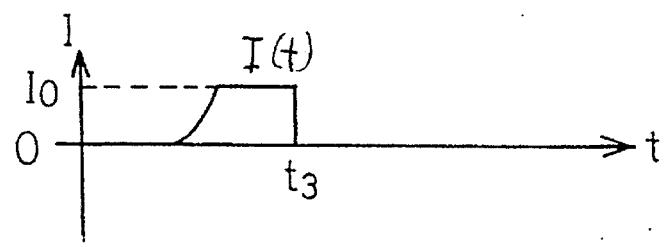
Figure 4:
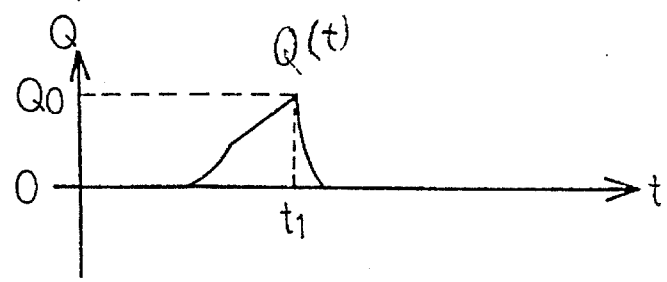

FIG. 3 illustrates the operation performed to create the pattern after the positioning operation. In FIG. 3, a bias voltage V(t) is applied to the sample stage 6 from the bias voltage source 15 during formation of each pixel pattern. The time variation of the bias voltage V(t) is shown in FIG. 4(a). The time variation of the corresponding current I(t) applied to the preamplifier 13 is shown in FIG. 4(b). The amount of electric charge Q(t) integrated by the integrator 14 is shown in the graph of FIG. 4(c).

Referring back to FIG. 3, the bias voltage V(t) applied from the bias voltage source 15 is increased in a ramp pattern as shown in FIG. 4(a). When V(t) reaches a certain voltage value, electrical current I(t) begins to flow between silicon substrate 5 and tip 4, as shown in FIG. 4(b). This current is detected by preamplifier 13. The bias voltage V(t) is adjusted so that the current is maintained at a constant value $I_0$. The weak current I(t) applied to preamplifier 13 is amplified by the preamplifier 13. Then, the current is integrated as the amount of charge Q(t) flowing in the current by the integrator 14, as shown in FIG. 4(c). If the amount of charge Q(t) reaches a given amount of charge $Q_0$ at instant of time $t_1$, the bias voltage V(t) is returned to zero volt (at time $t_2$). As a result, the magnitude of current I(t) flowing into preamplifier 13 goes back to 0 (at time $t_3$).

Figure 5A:
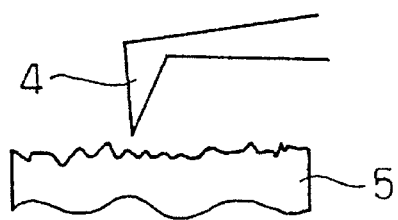
FIGS. 5(a) and 5(b) are diagrams illustrating the relations among the tip of a microelectronic processing machine according to the invention, surface roughness, and manufacturable line width.

Thereafter, signals are supplied to the x–y scanning system 9 to move the sample to the next position relative to tip 4. The process described thus far is repeated to form a desired pattern or figure on the surface of sample 5. In order to form a uniform oxide film, it is important that the temperature, the composition of the atmosphere around sample 5 (see FIG. 5a) and the amount of electric charge injected at each point on the sample surface be maintained constant. The uniformity of line width is affected by the area of the portion of tip 4 in contact with the surface of silicon substrate 5. Accordingly, where the surface of silicon substrate 5 is flat, the roughness of tip 4 is important.

Figure 5B:
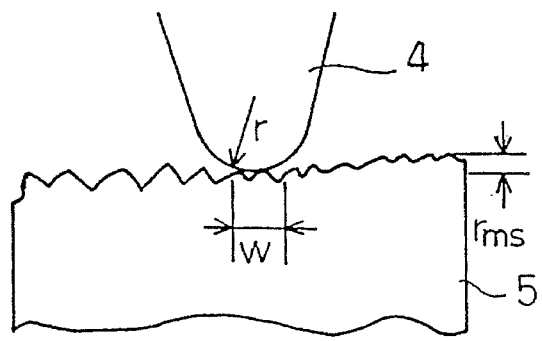

As shown in FIG. 5(b), where tip 4 has a spherical front end portion, positioning of tip 4 is less effected by the roughness of the sample surface. Let r be the radius of the spherical surface of the front end portion of tip 4 and $r_{ms}$ be the average roughness of the surface of silicon substrate 5 which faces tip 4. Assuming that $r >> r_{ms}$, the width W of tip 4 in contact with the surface of silicon substrate 5 is given by $$W = \sqrt{8 \cdot r \cdot r_{ms}} \tag{1}$$

Let us assume that r=10 nm and rms=1 nm. The width of the contact, or the minimum line width, is about 9 nm.

Figure 6:
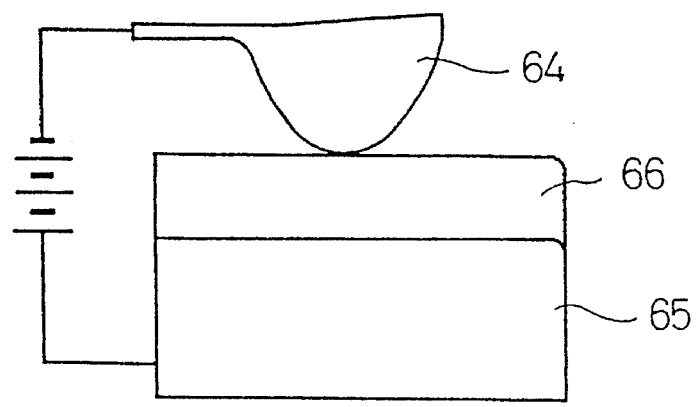
FIG. 6 is a diagram illustrating the principle on which an oxide film is formed by a microelectronic processing machine according to the invention.

FIG. 6 illustrates the operating principle of the novel machine when it forms an oxide film.

In FIG. 6, a thin silicon oxide film 66 is formed on a silicon substrate 65. A metal electrode 64, which may be identical to tip 4, located over the film is in contact with the film. A bias voltage is applied so that the silicon substrate 65 is at a positive potential and that the metal electrode 64 is at a negative potential. The electric field applied to the silicon oxide has a field strength of approximately $10^4$ to $10^3$ V/cm. In the presence of this strong electric field, oxygen within the silicon oxide is ionized by electrons such as those produced by tunneling current, as given by (2) below.

$$O_2 + e \rightarrow O^- + O \tag{2}$$

Within the silicon, an ionization takes place as given by (3) below.

$$Si \rightarrow Si^+ + e \tag{3}$$

It is considered that ions $O^-$ and $Si^+$ generated as given by Eqs. (2) and (3) react at the interface between the silicon and the silicon oxide, as given by Eq. (4) below and that a silicon oxide film is formed.

$$Si^+ + O^- + O \rightarrow SiO_2 \tag{4}$$

Paul J. Jorgensen, Journal of Chemical Physics, Vol. 37, Number 4, Aug. 15, 1962, describes that ions $O^-$ are affected by the electric field and contribute to the formation of an oxide film at a temperature of 850° C. In the present process, at the initial phase of oxidation, a strong electric field of $10^6$ to $10^8$ V/cm was applied to the very thin oxide film having a thickness of less than about 20 Å. It is thought that oxygen is ionized by the tunneling current or electrons drawn from the silicon substrate near the interface and contributes to the formation of the oxide film. An oxide film was formed by the above process even at room temperature. When the polarity of the bias voltage was inverted, almost no oxide film was formed. By controlling the current flowing between the metal electrode 64 and the silicon substrate 65 as given by Eqs. (2)–(4), the oxidation rate, and the oxide film thickness, can be controlled.

Although the description made thus far centers on the formation of a silicon oxide film, a silicon nitride film can also be formed by replacing the ambient gas with nitrogen. Furthermore, the silicon substrate may be any one of a silicon substrate terminating in hydrogen atoms, a substrate having a natural oxide film, and a silicon substrate having an ultrathin nitride film.

The present instrument can also be applied to detection and removal of metal impurities remaining on the surface of a silicon substrate. For this purpose, connections are made in such a way that the polarity of the bias voltage is reversed compared with the polarity shown in FIG. 6. In particular, the electrical current flowing between electrode 64 and silicon substrate 65 is monitored in the direction in which no silicon oxide film is formed. The electrical current increases at locations where metal impurities exist. At these locations, a voltage in the form of pulses is applied to the bias voltage source, resulting in local heating of the substrate. This evaporates off metal impurity atoms.

The instrument constructed as described above is based on an optical lever using an atomic force microscope. Techniques of an optical interferometer, a capacitance meter, and other similar instruments can be exploited to form other embodiments. Where atomic-level alignment is not required, a normal precision stage or the like may be used without employing a threedimensional piezoelectric scanner. In the above description, the force control system controls displacements of a miniature leaf spring or lever. An ordinary coil spring, diaphragm, and so forth can also be used.

An oxide film and a nitride film can be formed on a silicon substrate at room temperature according to the invention by applying a voltage between the silicon substrate and an electrode. Therefore, microminiature interconnects and patterns can be formed in the oxide film without the need of conventional processing of the substrate such as oxidation, lithography, and etching. Furthermore, the minimum line width can be reduced by a factor of 2 to 5 (down to 200 to 500 Å) compared with the line width accomplished heretofore. If the roughness of the substrate is reduced, and if smaller electrodes can be used, only certain atoms may be oxidized. Thus, the invention offers a tool for manufacturing atomic-scale devices. At present, the invention offers a tool for manufacturing MOSFETs of an ultramicroscopic structure. Additionally, the novel instrument can remedy defects by forming an oxide film at certain minute locations on a device. Further, the novel instrument can act as a subminiature mask-creating device by creating a pattern directly on a silicon substrate and forming an oxide film.

This application relates to subject matter disclosed in Japanese Application number 5-49713, filed on Mar. 10, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A microelectronic processing machine for forming a pattern on a surface of a sample substrate, comprising:

a sample holding stage for holding the sample substrate at a processing location;

an electrode disposed for contacting the surface of the sample substrate when the sample substrate is held by said holding stage;

a force control system coupled to said electrode for pressing said electrode against the surface of the sample substrate with a force;

a temperature control system for maintaining the surface of the sample substrate at a temperature when the sample substrate is held by said holding stage;

a bias power supply connected for supplying a electrical current between said electrode and the sample substrate when the sample substrate is held by said holding stage;

a weak current control system for detecting and controlling a weak current flowing between said electrode and the sample substrate when the sample substrate is held by said holding stage;

an integrator connected to said weak current control system for time-integrating the weak current for a given time;

a positioning mechanism coupled to said holding stage for moving the sample substrate when the sample substrate is held by said holding stage;

a nozzle disposed for introducing reactive gasses to form a film on the surface of the sample substrate; and a chamber for confining the reactive gases with controlled partial pressures, wherein all of said sample holding stage, said electrode, said force control system, said temperature control system, said positioning mechanism, and said nozzle are mounted in said chamber.

2. A microelectronic processing machine as defined in claim 1, wherein said temperature control system maintains the surface of the sample substrate at room temperature.

3. A microelectronic processing machine as defined in claim 1, wherein said electrode has a tip with a convex spherical surface via which said electrode contacts the sample surface.

4. A microelectronic processing machine as defined in claim 1, wherein when the sample substrate is a silicon substrate, said machine is operative for performing a procedure in which:

(A) electrical current flowing between the silicon substrate and said electrode is monitored;

(B) metal impurities on the silicon substrate are detected according to increases and decreases in the current;

(C) an electrical current in the form of pulses is applied to said bias power supply; and (D) detected impurities are locally heated to evaporate them off of the silicon substrate.

5. The microelectronic processing machine as defined in claim 1, in combination with a silicon substrate as the sample substrate, wherein:

(a) the silicon substrate is one of: a silicon substrate which terminates in hydrogen atoms; a silicon substrate provided with a natural oxide film; and a silicon substrate provided with an ultrathin nitride film, and (b) oxygen and nitrogen are used as the reactive gasses.

6. A microelectronic processing machine as defined in claim 5, further comprising circuitry for issuing instructions to control a bias voltage in such a way that an electrical current flowing into said ammeter during processing of a sample assumes a given value, to return the bias voltage to zero volt if a value obtained by integrating the current reaches a given value, and to move the sample into a next processing position.

7. A microelectronic processing machine as defined in claim 5, wherein said temperature control system maintains the surface of the sample substrate at room temperature.

8. A microelectronic processing machine as defined in claim 5, wherein said electrode has a tip with a convex spherical surface via which said electrode contacts the sample surface.

9. A microelectronic processing machine as defined in claim 5, wherein when the sample substrate is a silicon substrate, said machine is operative for performing a procedure in which:

(A) electrical current flowing between the silicon substrate and said electrode is monitored;

(B) metal impurities on the silicon substrate are detected according to increases and decreases in the current;

(C) an electrical current in the form of pulses is applied to said bias power supply; and (D) detected impurities are locally heated to evaporate them off of the silicon substrate.

10. A microelectronic processing machine as defined in claim 1, further comprising circuitry for issuing instructions to control a bias voltage of said bias power supply in such a way that the current flowing during processing of the sample substrate assumes a given value, to return the bias voltage to zero volt if an output value obtained by said integrator reaches a given value, and to move the sample substrate to a next processing position.

11. A microelectronic processing machine as defined in claim 10, wherein said temperature control system maintains the surface of the sample substrate at room temperature.

12. A microelectronic processing machine as defined in claim 10, wherein said electrode has a tip with a convex spherical surface via which said electrode contacts the sample surface.

\* \* \* \* \*